United States Patent [19]
Daniele et al.

[11] Patent Number: 5,949,666
[45] Date of Patent: Sep. 7, 1999

[54] STAIRCASE ADAPTIVE VOLTAGE GENERATOR CIRCUIT

[75] Inventors: Vincenzo Daniele, Brugherio; Alessandro Manstretta, Broni; Paolo Rolandi, Volpedo; Guido Torelli, S. Alessio Con Vialone, all of Italy

[73] Assignee: SGS-Thomson Microelectronics S.r.l., Agrate Brianza (MI), Italy

[21] Appl. No.: 09/032,282

[22] Filed: Feb. 26, 1998

[30] Foreign Application Priority Data

Feb. 28, 1997 [EP] European Pat. Off. ............ 97830084

[51] Int. Cl.⁶ .................. H02M 1/12; G05F 1/40; G05F 7/64

[52] U.S. Cl. .................. 363/43; 323/282; 323/288; 327/336

[58] Field of Search ............... 363/43; 323/282, 323/288, 265, 280; 327/336, 337

[56] References Cited

U.S. PATENT DOCUMENTS

| | | | |
|---|---|---|---|
| 4,365,204 | 12/1982 | Haque | 328/127 |
| 4,453,130 | 6/1984 | Bennett | 330/51 |
| 4,550,295 | 10/1985 | Sasaki | 333/19 |
| 4,636,738 | 1/1987 | Westwick et al. | 330/9 |
| 4,823,027 | 4/1989 | Takahashi | 307/353 |
| 5,142,238 | 8/1992 | White | 330/9 |
| 5,194,802 | 3/1993 | Hill et al. | 323/280 |
| 5,479,130 | 12/1995 | McCartney | 327/337 |
| 5,497,119 | 3/1996 | Tedrow et al. | 327/336 |
| 5,506,526 | 4/1996 | Seesink | 327/337 |
| 5,745,002 | 4/1998 | Baschirotto et al. | 327/337 |
| 5,774,390 | 6/1998 | Taillet | 364/807 |

FOREIGN PATENT DOCUMENTS 0745 996 A2  12/1996  European Pat. Off. ........ G11C 16/06

OTHER PUBLICATIONS

"Switched–capacitor transducers with digital or duty–cycle output based on pulse–width modulation technique," *International Journal of Electronics*, vol. 71, No. 2, Aug. 1991, pp. 265–278.

"TCMOS: Low noise power supply technique for digital ICs," *Electronics Letters*, vol. 31, No. 16, Aug. 1995, pp. 1338–1339.

*Primary Examiner*—Peter S. Wong
*Assistant Examiner*—Bao Q. Vu
*Attorney, Agent, or Firm*—Jenkins & Gilchrist PC

[57] ABSTRACT

A staircase adaptive voltage generator circuit comprising a first capacitor connected between a first voltage reference and an output operational amplifier, through first and second switches, respectively. The terminals of the capacitor are also connected to a second voltage reference through third and fourth switches, respectively. A second capacitor, in series with a fifth switch, is connected in parallel to the first capacitor.

17 Claims, 2 Drawing Sheets

5,949,666

STAIRCASE ADAPTIVE VOLTAGE GENERATOR CIRCUIT

FIELD OF THE INVENTION

The present invention relates generally to voltage regulating circuits and particularly to a circuit for generating a voltage having a programmable-step stepped waveform.

BACKGROUND OF THE INVENTION

Certain applications require the availability of an analog signal for trimming electronic systems, e.g., when changes in an electrical quantity are to be adjusted for any possible variations in ambient and/or processing conditions. In particular, trimming during an EEPROM erasing operation, as described in an article "An improved method for programming a word-erasable EEPROM", G. Torelli and P. Lupi, *ALTA FREQUENZA*, Vol. LII, No. 6, November/December 1983, pages 487–494, involves the driving of high capacitive impedance inputs. For such cases, a circuit is needed which can provide for both coarse and fine adjustments of the trimming signal so that the time requirements of the overall control action can be kept low.

The terms fine/coarse adjustment mean here a control form which can produce minimum and maximum changes in the control parameter. Thus, the trimming pulses are amplitude, rather than time, modulated.

A prior approach to the provision of a stepped waveform voltage is based on the digitally controlled resistive partition principle as described by Tedrow et al. in U.S. patent application No. PCT/US95/05588 entitled "High precision voltage regulation circuit for programming multilevel flash memory". However, the voltage quantization in this reference is tied to the number of passive components (resistors), since fine change ranges can only be obtained by using a large number of resistors.

Many applications require that the staircase in the trimming voltage waveform have a suitably steep rising edge, e.g., where the staircase derivative is slight, so that the loss in useful time can be a small percent. In this case, the equivalent output resistance of the network that is generating the voltage staircase should be quite low, if the capacitive load is a large one.

What is needed is a circuit for generating a voltage having a stepped waveform whose step can be programmed in digital form, which is more accurate and economical than known circuits, and can drive high input capacitance nodes.

SUMMARY OF THE INVENTION

Accordingly, the present invention provides a staircase adaptive voltage generator circuit. The circuit comprises a first capacitor having first and second terminals wherein the first terminal is connected, through a first switch, to a first voltage reference, an operational amplifier having an output terminal, a first input terminal connected through a second switch to the second terminal of the first capacitor and a second terminal connected to a second voltage reference. The first and second terminals of the first capacitor are connected through third and fourth switches, respectively, to the second voltage reference, and a feedback capacitor connected between the first input terminal and the output terminal of the operational amplifier.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of a voltage generating circuit according to the present invention will be apparent from the following description of an embodiment thereof, given by way of non-limitative example with reference to the accompanying drawing.

DETAILED DESCRIPTION OF A PREFERRED EMBODIMENT OF THE INVENTION

Figure 1:
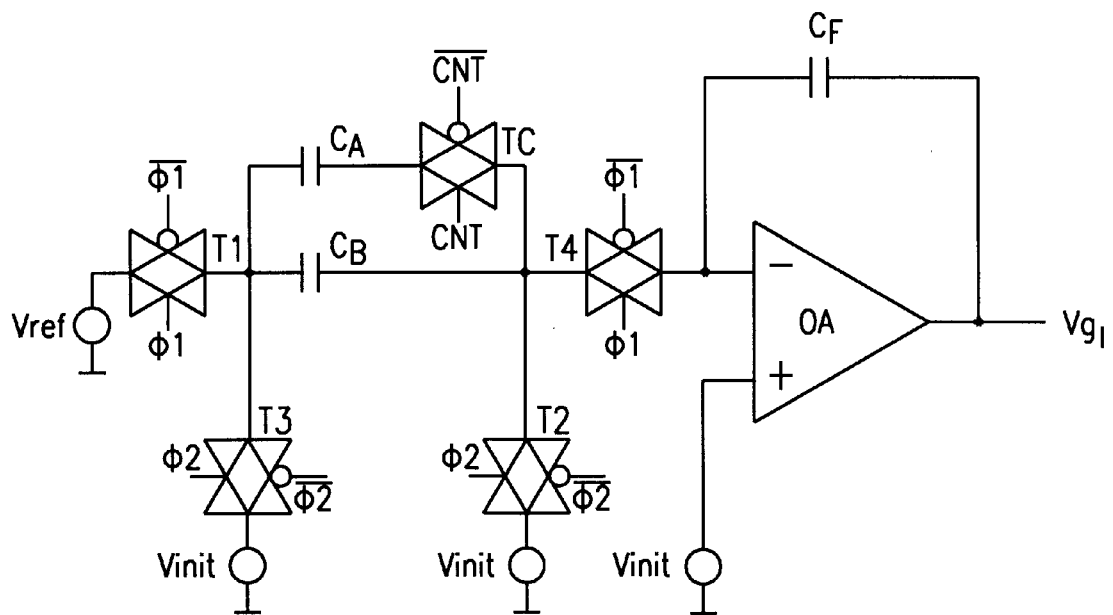
FIG. 1 shows a circuit diagram of a circuit for generating a stepped waveform voltage whose step is programmable according to the present invention.

Referring now to FIG. 1, a circuit according to the present invention is shown embodying a switched capacitance integrator of the inverting type which comprises an operational amplifier OA and four switches T1, T2, T3, T4 of the transmission gate type. The circuit is implemented with CMOS technology and is driven by signals having phases 01, 02 and corresponding signals with negated phases 01, 02. Two integration capacitors $C_A$ and $C_B$ are connected in parallel with each other through a switch TC which is driven by a signal CNT and its corresponding negated signal, a feedback capacitor $C_F$, and two voltage generators Vref and Vinit.

Figure 2:
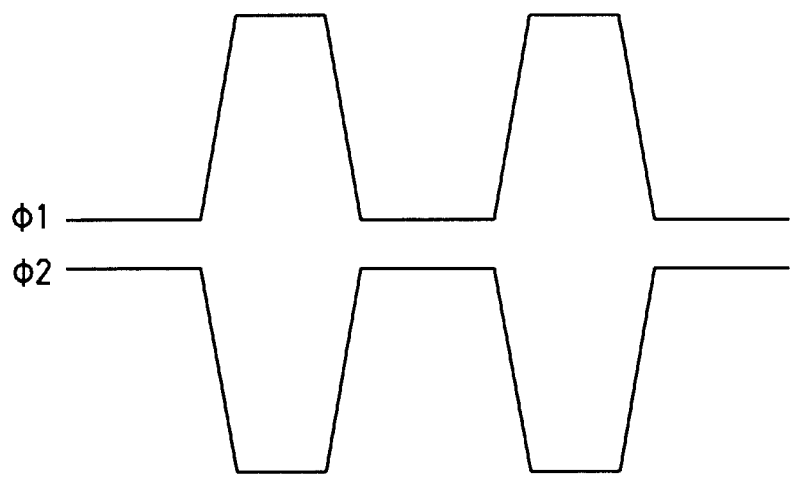
FIG. 2 is a phase diagram illustrating phases 01 and 02 according to the present invention.

The phases 01, 02 are generated such that they do not overlap such as illustrated in FIG. 2. The operational amplifier should have a very high output dynamic range.

With ideal circuit components throughout, the output voltage would be incremented at each switching of 01, 02 by an amount, $$\Delta vg = |Vinit - Vref|(C_I/C_F)$$

where, $C_I$ is the input capacitance existing between T1 and T4, and $C_F$ is the feedback capacitance of the amplifier OA. The staircase gradient may be positive when Vinit>Vref, or negative when Vinit<Vref. Step stability is determined by the voltage difference Vinit–Vref and the ratio $C_I/C_F$. A logic network for controlling the programmed state acts on the selection of the input capacitance through the switch TC. It can be implemented in a known manner to the skilled ones, and is not shown in the drawing.

If TC is open, $C_I = C_B$, and the output staircase is incremented by $\Delta Vg' = |Vinit - Vref|(C_B/C_F)$. If TC is closed, the capacitance $C_I$ is $C_A + C_B$, and the increment is $\Delta Vg'' = |Vinit - Vref|((C_A + C_B)/C_F) > \Delta Vg'$. Of course, there could be provided several capacitors CA1, CA2, ..., CAn, connected in parallel to CB and independently switchable (FIG. 3), instead of a single capacitor. The stepped staircase is generated from an appropriate value Vinit.

Table 1 shows possible component dimensionings for an exemplary operation of the circuit. With this choice, changes $\Delta Vg'=250$ mV and $\Delta Vg''=750$ mV are obtained. If the duration time of the program pulse (f 01, 02=2 ΔIHz) is 1 μs, then the programming of one cell would be completed within 100 μs.

TABLE 1

| Vinit | 6 V |
|---|---|
| Vref | 5 V |
| $C_A$ | 500 fF |
| $C_B$ | 250 fF |
| $C_F$ | 1 pF |
| Vpp | 12 V |
| 01, 02 | 0–12 V |

Figure 3:
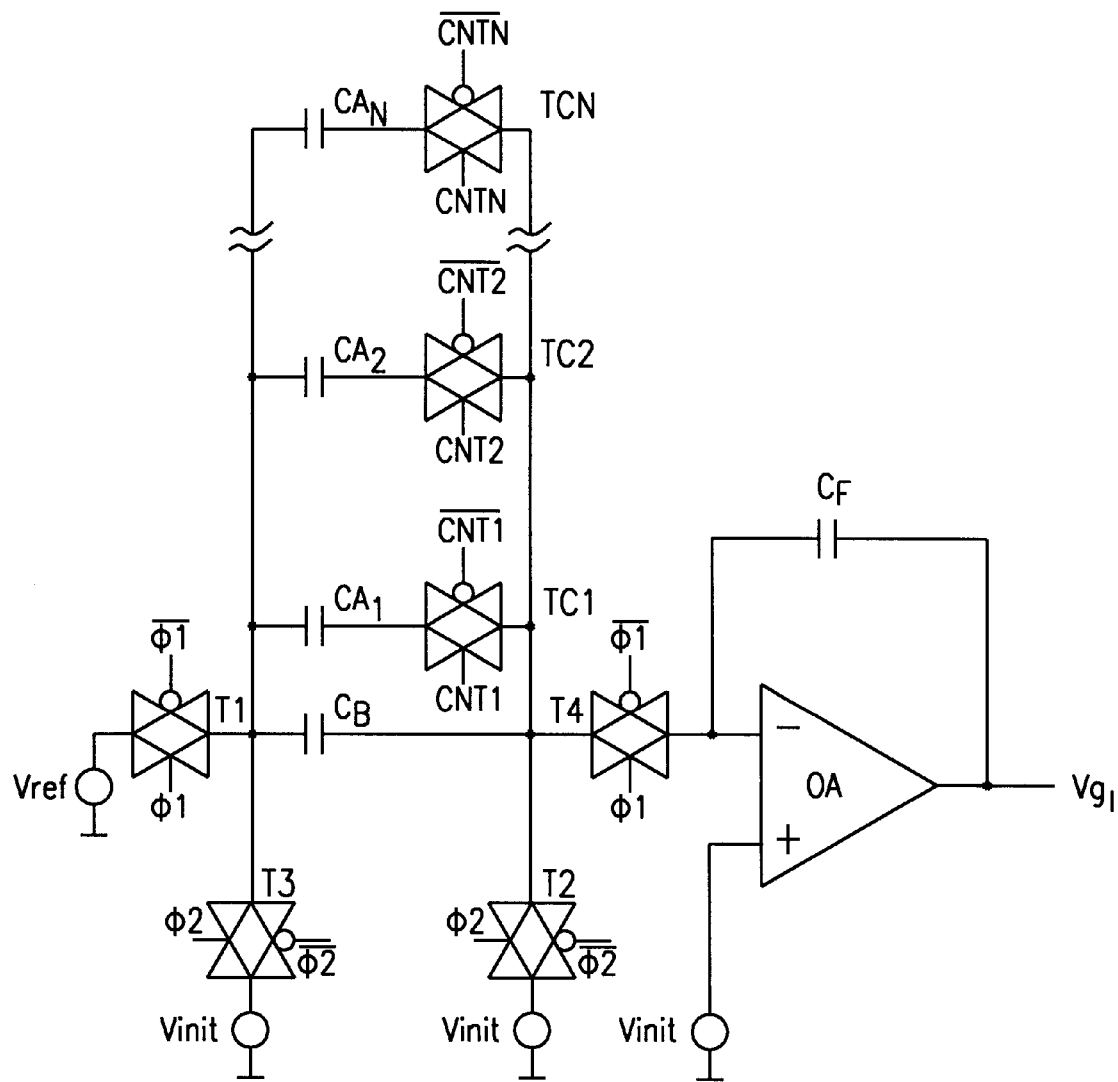
FIG. 3 shows a circuit diagram of a second circuit for generating a stepped waveform voltage whose step is programmable according to the present invention.

Thus, the circuit allows the width of each step of the stepped voltage to be changed by acting digitally on the signal CNT (or signals CNT1, CNT2, . . . , CNTn in the instance of multiple capacitors as shown in FIG. 3).

The above circuit utilizes to advantage switched capacitors to provide improved accuracy and stability for the change ΔVg. This value is caused to depend on the capacitor ratio and the accuracy of the difference between the reference voltage Vref and Vinit.

Inherent malfunction phenomena such offset voltage of the operational amplifier and finite gain of the same clock feedthrough are trivial to many applications, and in particular, the circuit construction described hereinabove is insensitive to parasitic capacitance.

This invention has several advantages over the aforementioned prior art.

The accuracy of the quantization step of the staircase ΔVg is dependent on the ratio of integrated capacitances ($C_I/C_F$) whose relative precision is higher than that of the ratio between integrated resistances, and on the precision of the difference |Vinit−Vref|, which has to be stabilized using a suitable circuit according to the prior art.

As regards programmability, this circuit affords control on the actual initial value of the staircase, as well as fine step control. By controlling the starting voltage value, adaptive programming is allowed, since Vinit can be held fixed while a small difference is programmed by acting on the capacitors paralleled to CB. The fine step can be set separately for each cell to be programmed, so as to accommodate process variations. By controlling the step of the voltage staircase, the programming speed can be controlled.

The circuit of this invention allows the driving of high capacitive loads. By using a self-compensated operational amplifier, that is one compensated by the load capacitance itself, such as a so-called folded-cascade structure, the need for a high capacitance value, in the same order of magnitude as the load, for frequency compensation can be avoided. This is advantageous in terms of integration area, and often of operation speed.

Furthermore, the use of an integrated structure SC with CMOS technology greatly reduces power dissipation compared to the resistive partition approach, for a given operation speed of the structure.

The circuit of this invention has set dimensions which are neither dependent on the step number of the staircase nor on step accuracy. Compared to the prior art based on the use of integrated resistors, this invention uses just two integrated capacitors of relatively low value in its most elementary of versions. The relative accuracy of integrated resistors is definitely minor compared with integrated capacitors. The quantization achieved with resistive partition makes the staircase step dependent on the number of resistors employed.

Applications for this circuit include, but are not limited to, the generation of an analog signal whose width can be determined with very high accuracy, and changes whereof can be selected in digital form.

It should be understood that modifications or substitutions may be made unto the embodiment described hereinabove in manners known to the skilled persons in the art. For example, for a reduced degree of programming flexibility, a single switched capacitor CB could be used.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A staircase adaptive voltage generator circuit, comprising:
   a first capacitor having first and second terminals wherein the first terminal is connected, through a first switch, to a first voltage reference;
   an operational amplifier having an output terminal, a first input terminal connected through a second switch to the second terminal of the first capacitor and a second terminal connected to a second voltage reference; and wherein
   the first and second terminals of the first capacitor are connected through third and fourth switches, respectively, to the second voltage reference;
   a feedback capacitor connected between the first input terminal and the output terminal of the operational amplifier; and
   a second capacitor having a first terminal connected to the first terminal of the first capacitor and a second terminal connected to the second terminal of the first capacitor through a fifth switch.

2. The generator circuit according to claim 1, wherein the first and second switches are driven by switch signals having phases that do not overlap the phases of the switch signals driving the third and fourth switches.

3. The generator circuit according to claim 2, wherein said circuit is integrated with CMOS technology.

4. The generator circuit according to claim 1, wherein said circuit is integrated with CMOS technology.

5. The generator circuit according to claim 1, further including:
   a plurality of second capacitors, each second capacitor having a first terminal connected to one of the first and second terminals of the first capacitor and a second terminal connected to the other one of the first and second terminals of the first capacitor through a distinct fifth switch.

6. The generator circuit according to claim 5, wherein:
   each fifth switch is controlled independently from other ones of the fifth switches.

7. A switched-capacitor integrator, comprising:
   an operational amplifier having a first input terminal connected to a first reference voltage, a second input terminal and an output terminal;
   a feedback capacitor having a first terminal connected to the second input terminal of the operational amplifier and a second terminal connected to the output terminal thereof;
   a first switching element;

a first capacitor having a first terminal coupled to the operational amplifier through the first switching element and a second terminal;

a second switching element connected between the second terminal of the first capacitor and a second reference voltage;

a third switching element connected between the second terminal of the first capacitor and the first reference voltage;

a fourth switching element connected between the first terminal of the first capacitor and the first reference voltage; and a circuit for selectively varying the capacitance appearing between the first and second terminals of the first capacitor.

8. The switched-capacitor integrator of claim 7, wherein:

the circuit for selectively varying the capacitance comprises a series-connected combination of a second capacitor and a fifth switching element being connected in parallel relation with the first capacitor between the first and second terminals thereof.

9. The switched-capacitor integrator of claim 7, wherein:

the circuit for selectively varying the capacitance comprises a plurality of series-connected combinations of a second capacitor and a fifth switching element, each series-connected combination being connected in parallel relation with the first capacitor between the first and second terminals thereof.

10. The switched-capacitor integrator of claim 9, wherein:

each individual fifth switching element is activated by a distinct control signal.

11. The switched-capacitor integrator of claim 7, wherein:

the first and second switching elements are activated by at least one first control signal;

the third and fourth switching elements are activated by at least one second control signal; and the first and second control signals are non-overlapping signals relative to each other.

12. A circuit for generating a signal having a stepped voltage waveform, comprising:

an operational amplifier having a first input terminal connected to a first reference voltage, a second input terminal and an output terminal;

a feedback capacitor having a first terminal connected to the second input terminal of the operational amplifier and a second terminal connected to the output terminal thereof;

a capacitance being selectively coupled to the second input terminal of the operational amplifier so as to cause the output terminal of the operational amplifier to produce the stepped voltage waveform wherein a voltage of each step thereof is directly proportional to a capacitance value of the capacitance and inversely proportional to the capacitance value of the feedback capacitor; and a control circuit for selectively controlling an amplitude of one or more steps of the stepped voltage waveform independently from control of other steps thereof.

13. The circuit according to claim 12, further including:

a plurality of first switching elements connected between the capacitance and a plurality of reference voltages and between the capacitance and the second terminal of the operational amplifier.

14. The circuit according to claim 12, wherein:

the control circuit operates to select the capacitance value of the capacitance.

15. The circuit according to claim 12, wherein:

the control circuit comprises a first capacitor connected in parallel relation with a series-connected combination of a second capacitor and a switching element.

16. The circuit according to claim 12, wherein:

the control circuit comprises a first capacitor connected in parallel relation with each of a plurality of series-connected combinations of a second capacitor and a switching element.

17. The circuit according to claim 16, wherein:

each switching element is controlled by a distinct control signal.

* * * * *